US012706285B2

(12) United States Patent
Tran et al.

(10) Patent No.: US 12,706,285 B2
(45) Date of Patent: Aug. 11, 2026

(54) SYSTEM AND METHOD FOR ADAPTIVE CLEANING OF A HIGH-VACUUM CHAMBER

(71) Applicant: IBSS Group, South San Francisco, CA (US)

(72) Inventors: Larry Tran, South San Francisco, CA (US); Vince Carlino, South San Francisco, CA (US); George Naugle, Morgan Hill, CA (US)

(73) Assignee: IBSS Group, San Francisco, CA (US)

( * ) Notice: Subject to any disclaimer, the term of this patent is extended or adjusted under 35 U.S.C. 154(b) by 47 days.

(21) Appl. No.: 18/884,164

(22) Filed: Sep. 13, 2024

(65) Prior Publication Data

US 2026/0081122 A1 Mar. 19, 2026

(51) Int. Cl.
*H01J 37/32* (2006.01)

(52) U.S. Cl.
CPC .. *H01J 37/32862* (2013.01); *H01J 37/32449* (2013.01); *H01J 37/32834* (2013.01); *H01J 37/32926* (2013.01); *H01J 37/32981* (2013.01); *H01J 2237/0225* (2013.01)

(58) Field of Classification Search
CPC ......... H01J 2237/0225; H01J 37/32449; H01J 37/32834; H01J 37/32862; H01J 37/32926; H01J 37/32981
See application file for complete search history.

(56) References Cited

U.S. PATENT DOCUMENTS 6,146,492 A * 11/2000 Cho ................. H01J 37/32935 156/345.24

FOREIGN PATENT DOCUMENTS

JP H11265878 A * 9/1999

OTHER PUBLICATIONS

Machine translation JPH11-265878A (Year: 1999).*

* cited by examiner

*Primary Examiner* — Douglas Lee
(74) *Attorney, Agent, or Firm* — Benjamin J. Carroll; VLP Law Group LLP

(57) ABSTRACT

A system and a method for an adaptive plasma-cleaning process for a reaction chamber allow continual monitoring by a residual gas analyzer, while active plasma-cleaning is carried out in the reaction chamber. The system includes a valve system and a pump system that allow the residual gas analyzer to perform continual monitoring at a favorable pressure condition that is independent of the active plasma-cleaning process.

7 Claims, 2 Drawing Sheets

SYSTEM AND METHOD FOR ADAPTIVE CLEANING OF A HIGH-VACUUM CHAMBER

BACKGROUND OF THE INVENTION

1. Field of the Invention

The present invention relates to a design for a system that includes a plasma or glow discharge generation device ("plasma generation device"), in which reactive gases are ionized into reactive species in a plasma state and supplied to a downstream high-vacuum reaction chamber ("HV chamber") where the reactive species participate in a chemical reaction, such as a cleaning application.

2. Discussion of the Related Art

In a plasma cleaning application, a plasma generation device provides a high-vacuum (HV) reaction chamber with gaseous reactive species in the plasma state that react with contaminants in the HV reaction chamber to form products that are carried away in the effluent gas under vacuum. Contaminants in the HV reaction chamber may be detected using a residual gas analyzer (RGA) having access to the HV chamber. Thus, such an RGA is typically used after the cleaning operation (i.e., after the plasma generation is shut down) to determine if the contamination in an HV chamber is at an acceptable level. Detection by the RGA cannot be carried out while the plasma reaction is ongoing in the HV chamber, as an RGA is typically required to operate at a lower pressure than the desirable pressure for the plasma reaction. In some cleaning operations, the duration required for the plasma reaction to complete varies significantly (e.g., between a few hours to a few days). Therefore, in the prior art, a conservative practice typically maintains the plasma reaction for a lengthy period (e.g., 50 hours) that is significantly longer than necessary for the typical case. Occasionally, the same cleaning is repeated for the same lengthy period, if the RGA detects that contaminants are still present at greater than the acceptable level. To repeat the cleaning process requires bringing HV chamber 102 and RGA 107 back to the pressure and the temperature conditions for the cleaning process, which further increase the process time required.

An improved cleaning process is desired.

SUMMARY

According to one embodiment of the present invention, a system for adaptively monitor a plasma cleaning process in a reaction chamber, includes: (i) one or more plasma generation devices configured to provide reactive species into the reaction chamber; (ii) a residual gas analyzer; (iii) a first vacuum pump configured for reducing pressure in the reaction chamber; (iv) a second vacuum pump configured to prevent pressure in the residual gas analyzer from rising above a predetermined value; (v) a valve system selectively configurable to one of two states: (a) a first state, wherein the reaction chamber and the residual gas analyzer are connected by an opening of a first cross section area; and (b) a second state, wherein the reaction chamber and the residual gas analyzer are connected by an opening of a second cross section area that is much greater than the first cross section area; and (vi) a controller which operates the first and the second vacuum pumps, the residual gas analyzer; and which (a) (1) activates the plasma generation devices, and (2) sets the valve system to the first state, so as to allow the residual gas analyzer to continually monitor the plasma cleaning process that is enabled by the reactive species introduced into the reaction chamber; and (b)(1) deactivates the plasma generation device; and (2) sets the valve system to the second state, so as to ascertain that the plasma cleaning process is substantially complete.

According to one embodiment of the present invention, the controller determines from measurements made by the residual gas analyzer whether or not contamination in the reaction chamber has been reduced below a target level of contamination.

According to one embodiment of the present invention, the valve system may be implemented by a needle valve and a gate valve, wherein the gate valve is activated only when the valve system is set to the second state.

According to one embodiment of the present invention, the reaction chamber includes one or more heaters operable by the controller that allow the reaction chamber to be brought to a pre-determined temperature.

According to one embodiment of the present invention, the controller may be implemented by application software running on a computer.

According to one embodiment of the present invention, a method for controlling a plasma cleaning process in a reaction chamber, includes: (i) connecting a plasma generation device to provide reactive species into the reaction chamber; (ii) connecting a residual gas analyzer to the reaction chamber through a valve system, the valve system being selectively configurable to one of two states: (a) a first state, wherein the reaction chamber and the residual gas analyzer are connected by an opening of a first cross section area; and (b) a second state, wherein the reaction chamber and the residual gas analyzer are connected by an opening of a second cross section area that is much greater than the first cross section area; (iii) initiating operation of (a) a first vacuum pump, which configured for reducing pressure in the reaction chamber; and (b) a second vacuum pump, the second pump being configured to prevent pressure in the residual gas analyzer from rising above a predetermined value; (iv) making a measurement in the residual gas analyzer; (v) while the measurement in the residual gas analyzer indicates the reaction chamber is above a predetermined acceptable level of contamination: (a) setting the valve system to its first state; and (b) operating the plasma generating device, while monitoring each measurement made by the residual gas analyzer, until the measurement indicates that the reaction chamber is at or below the predetermined acceptable level of contamination; (vi) (a) setting the valve system to its second state; (b) making an additional measurement with the residual gas analyzer; (c) determining whether or not the additional measurement indicates that the reaction chamber remains at or below the predetermined acceptable level of contamination; and (d) repeating steps (iv) and (v) when the additional measurement indicates that the reaction chamber is above the predetermined acceptable level of contamination; and (vii) terminating the cleaning process. In some embodiments, step (vi) may be repeated only up to a predetermined number of times.

According to one embodiment of the present invention, the method is carried out under control of a controller, which may be implemented by software running on a computer.

These and other advantages, aspects, and novel features of the present invention, as well as details of an illustrated embodiment thereof, will be more fully understood upon consideration of the following description and drawings.

Figure 1:
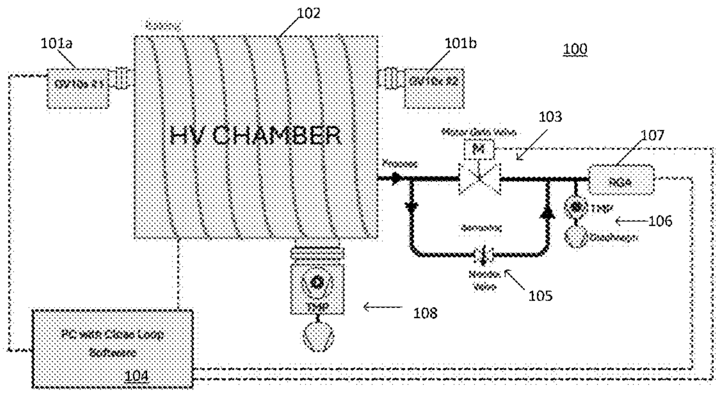
FIG. 1 is a functional block diagram showing system 100, provided for plasma cleaning HV chamber 102, according to one embodiment of the present invention.

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION OF THE PREFERRED EMBODIMENTS

FIG. 1 is a functional block diagram showing system 100, which is provided for plasma cleaning HV chamber 102, according to one embodiment of the present invention. HV chamber 102 may be, for example, any HV reaction chamber found in a semiconductor manufacturing tool (e.g., a chemical vapor deposition tool).

Prior to entering service, HV chamber 102 is typically plasma-cleaned to reduce undesirable contaminants (e.g., moisture, oils, any organic residues, and lubricants) introduced during HV chamber 102's manufacturing. Such contaminants are believed chemically bonded to the walls of HV chamber 102. As shown in FIG. 1, for the cleaning application, plasma generation devices ("Ashers") 101*a* and 101*b* are connected to HV chamber 102. Under operating conditions, Ashers 101*a* and 101*b* create and introduce compressed dry air (CDA), one or more other gaseous species, or one or more gaseous reactive species into HV chamber 102 to react with the contaminants, thereby forming volatile products that can be carried away in the effluent gas stream. The vacuum condition in HV chamber 102 is created by vacuum pump 108, which may be implemented by a turbomolecular pump. The turbomolecular pump is typically backed up by a diaphragm pump. Alternatively, an ion pump may also be used. The reaction may involve the gaseous reactive species in the plasma state breaking the bonds between the contaminants and the walls of HV chamber 102.

In one embodiment, the cleaning operation may be carried out, for example, at a pressure of approximately $1.0\times10^{-3}$ torr, and at a baking temperature between 100° C. and 300° C. The temperature may be achieved using heating elements (not shown). Reaction chambers (e.g., HV chamber 102) for semiconductor manufacturing tools are typically wrapped with such heating elements. Although two Ashers are shown in FIG. 1, one of them is optional; in fact, any number of Ashers may be provided to simultaneously supply the gaseous reactive species. However, in many applications, only one Asher is required. Each additional Asher reduces the duration of the cleaning operation.

A residual gas analyzer (RGA) 107 is connected to HV chamber 102 for detecting contaminants in the effluent gas stream. Typically, RGA 107 operates at a pressure of $1.0\times10^{-4}$ torr or lower. As shown in FIG. 1, RGA 107 samples the effluent gas stream through either needle valve 105 or gate valve 103. Needle valve 105, when open, samples a small volume of the effluent gas stream to enter RGA 107. By contrast, gate value 105 allows a much larger volume of the effluent gas stream to enter RGA 107. RGA 107 is provided vacuum pump 106, which prevents the operating pressure at RGA 107 from rising above an upper operating limit (e.g., $1.0\times10^{-4}$ torr). In some RGAs, operating the RGA above the upper operating limit may cause damage to the instrument.

Figure 2:
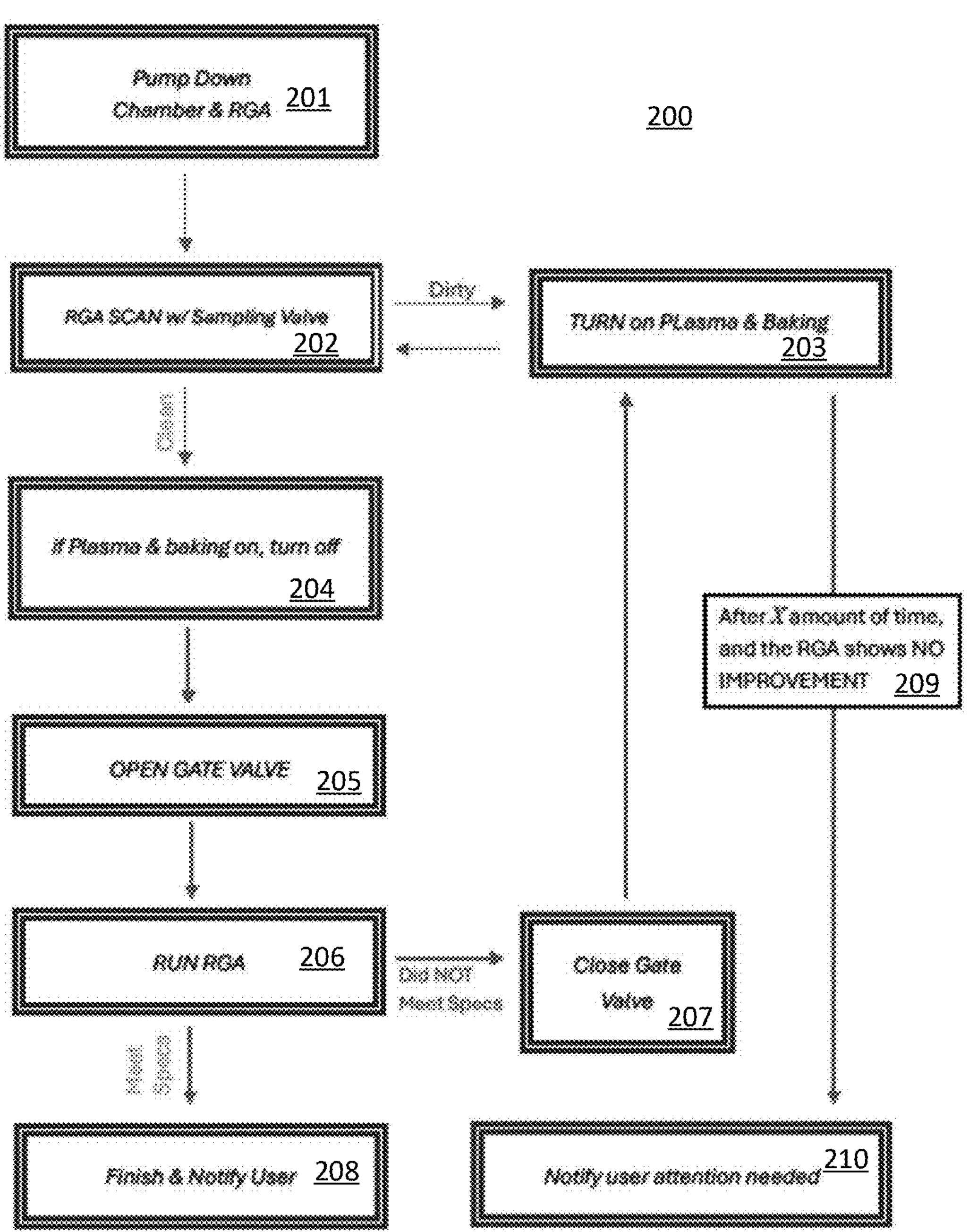
FIG. 2 is a flow chart illustrating adaptive cleaning process 200, according to one embodiment of the present invention.

The operations of an adaptive or "closed loop" cleaning process of the present invention can be carried out in system 100 under control of controller 104. Controller 104 may be implemented, for example, by software running on a computer (e.g., a laptop or desktop computer), or by a control circuit configured to control the cleaning process. FIG. 2 is a flow chart illustrating adaptive cleaning process 200, according to one embodiment of the present invention.

Initially, Ashers 101*a* and 101*b* are not operating, and HV chamber 102 and RGA 107, are provided at atmospheric pressure. As shown in FIG. 2, at step 201, controller 104 initiates cleaning process 200, causing vacuum pumps 106 and 108 to operate, thereby bringing HV chamber 102 and RGA 107 into vacuum conditions (e.g., below $1.0\times10^{-4}$ torr or lower at both HV chamber 102 and RGA 107). At step 202, controller 104 opens needle valve 105 to introduce a sampled portion of the effluent gas stream into RGA 107, which provides an output signal to controller 104, indicating the contamination condition in HV chamber 102. If the output signal from RGA 107 is determined by controller 204 to indicate that cleaning is not required (i.e., contamination in HV chamber 102 is at or below a target level of contamination), controller 104 proceeds to step 204 (see below). However, if the output signal from RGA 107 is determined by controller 204 to indicate that cleaning is required, controller 104 causes at step 203 the heaters in HV chamber 102 to bring HV chamber 102 ("bake") to the operating temperature, which may be between 100° C. and 200° C., for example. Controller 104 also activates Ashers 101*a* and 101*b* to provide the plasma-state reactive species into HV chamber 102, which raises the pressure in HV chamber 102 to above the pressure at RGA 107 (e.g., $1.0\times10^{4}$ torr). Because needle valve 105 provides a very small cross section, vacuum pump 106 can maintain a pressure differential across needle valve 105 and to prevent the pressure at RGA 107 from rising above the upper operating limit.

During step 203, RGA 107 continually monitors the contamination condition in HV chamber 102 through the gas stream brought through needle valve 105, while the cleaning reaction in HV chamber 102 takes its course. Continual monitoring is possible because of the pressure differential across needle valve 105. Eventually (e.g., after 5 hours), RGA 107 detects that the contamination condition in HV chamber 102 has been reduced to below a predetermined acceptable level. When that event occurs, RGA 107's output signal indicates to controller 104 that step 203 is complete. Controller 104 then proceeds to step 204.

At step 204, controller 104 deactivates both Ashers 101*a* and 101*b* and the heaters. Meanwhile, the continued operations of vacuum pump 108 reduces HV chamber 102 to a low pressure (e.g., much lower than $1.0\times10^{4}$ torr). In fact, a successful cleaning (i.e., having significantly reduced ion contaminants) should allow RGA 107 to give substantially the same contamination reading, even when vacuum pump 108 reduces the pressure in HV chamber 102 to $1.0\times10^{-6}$ torr or even lower. At step 205, controller 104 opens gate valve 103, which has a significantly larger cross section than needle valve 105, so that the portion of the gas stream introduced into RGA 107 is sampled from an expanded, much larger volume. Opening gate valve 103 also substantially equalizes the pressure between HV chamber 102 and RGA 107.

Thereafter, at step 206, from the expanded gas stream, RGA 107 measures the contamination condition in HV chamber 102. From this measurement, controller 204 determines whether the contamination level in HV chamber 102 remains at or below the predetermined acceptable level. If so, the cleaning process is complete. At step 208, controller 104 deactivates RGA 107 and vacuum pumps 106 and 108, thereby returning HV chamber 02 back to the initial conditions. Otherwise, i.e., if the contamination level in HV chamber 102 has returned to a level above the predetermined acceptable level, at step 207, controller 104 closes gate valve 103. Controller 104 then repeats steps 203-206 until controller 204 determines at repeated step 206 that RGA 107's measurement indicates that the contamination level remains below the predetermined acceptable level. Thus, the cleaning process of the present invention reduces the total cleaning time to substantially only what is necessary.

In some situations, even after steps 203-206 have been repeated a specified number of times, the goal of achieving a contamination level in HV chamber 102 below the predetermined acceptable level is not achieved (i.e., condition 209). In that event, at step 210, controller 207 informs the user that an exception condition has occurred that requires user intervention.

The above detailed description is provided to illustrate specific embodiments of the present invention and is not intended to be limiting. Numerous variations and modifications within the scope of the present invention are possible. The present invention is set forth in the accompanying claims.

We claim:

1. A method for controlling a plasma cleaning process in a reaction chamber, comprising:

(i) connecting a plasma generation device to provide reactive species into the reaction chamber;

(ii) connecting a residual gas analyzer to the reaction chamber through a valve system, the valve system being selectively configurable to one of two states: (a) a first state, wherein the reaction chamber and the residual gas analyzer are connected by an opening of a first cross section area; and (b) a second state, wherein the reaction chamber and the residual gas analyzer are connected by an opening of a second cross section area that is much greater than the first cross section area;

(iii) initiating operation of (a) a first vacuum pump, which configured for reducing pressure in the reaction chamber; and (b) a second vacuum pump, the second pump being configured to prevent pressure in the residual gas analyzer from rising above a predetermined value;

(iv) making a measurement in the residual gas analyzer;

(v) while the measurement in the residual gas analyzer indicates the reaction chamber is above a predetermined acceptable level of contamination:

(a) setting the valve system to its first state; and (b) operating the plasma generating device, while monitoring each measurement made by the residual gas analyzer, until the measurement indicates that the reaction chamber is at or below the predetermined acceptable level of contamination;

(vi) (a) setting the valve system to its second state; (b) making an additional measurement with the residual gas analyzer; (c) determining whether or not the additional measurement indicates that the reaction chamber remains at or below the predetermined acceptable level of contamination; and (d) repeating steps (iv) and (v) when the additional measurement indicates that the reaction chamber is above the predetermined acceptable level of contamination; and (vii) terminating the cleaning process.

2. The method of claim 1, wherein step (vi) is repeated only up to a predetermined number of times.

3. The method of claim 1, wherein the method is carried out under control of a controller.

4. The method of claim 3, wherein the controller is implemented by software running on a computer.

5. The method of claim 1, wherein the valve system comprises a needle valve and a gate valve, wherein the gate valve is activated only when the valve system is set to the second state.

6. The method of claim 1 wherein, during operation of the plasma generation device, the reaction chamber is brought to a pre-determined temperature.

7. The method of claim 1, further comprising a second plasma generation device connected to the reaction chamber, and wherein step (v)(b) is carried out with both plasma generation devices operating.

* * * * *